United States Patent
Yu et al.

(10) Patent No.: US 7,514,360 B2
(45) Date of Patent: Apr. 7, 2009

(54) THERMAL ROBUST SEMICONDUCTOR DEVICE USING HFN AS METAL GATE ELECTRODE AND THE MANUFACTURING PROCESS THEREOF

(76) Inventors: Hong Yu Yu, 10 Kent Ridge Crescent, Singapore (SG) 119260; Ming-Fu Li, 10 Kent Ridge Crescent, Singapore (SG) 119260; Dim-Lee Kwong, 10 Kent Ridge Crescent, Singapore (SG) 119260; Lakshmi Kanta Bera, 10 Kent Ridge Crescent, Singapore (SG) 119260

(*) Notice: Subject to any disclaimer, the term of this patent is extended or adjusted under 35 U.S.C. 154(b) by 212 days.

(21) Appl. No.: 10/802,563

(22) Filed: Mar. 17, 2004

(65) Prior Publication Data

US 2005/0205947 A1 Sep. 22, 2005

(51) Int. Cl.
*H01L 21/44* (2006.01)

(52) U.S. Cl. .................. 438/656; 438/382; 438/648; 257/388; 257/412; 257/E21.163

(58) Field of Classification Search .......... 438/199, 438/582, 648, 221, 230, 231, 585, 656, 683–685, 438/785, 584, 597, 652; 257/388, 412, E23.163
See application file for complete search history.

(56) References Cited

U.S. PATENT DOCUMENTS

| | | | |
|---|---|---|---|
| 5,960,270 A | 9/1999 | Misra et al. ............... 438/197 |
| 6,043,157 A | 3/2000 | Gardner et al. ............ 438/692 |
| 6,051,487 A | 4/2000 | Gardner et al. ............ 438/585 |
| 6,083,836 A | 7/2000 | Rodder .................... 438/690 |
| 6,208,004 B1 | 3/2001 | Cunningham ............. 257/413 |
| 6,225,168 B1 | 5/2001 | Gardner et al. ............ 438/287 |
| 6,383,879 B1 | 5/2002 | Kizilyalli et al. .......... 438/303 |
| 6,479,362 B2 | 11/2002 | Cunningham ............. 438/369 |
| 6,511,911 B1 | 1/2003 | Besser et al. .............. 438/656 |
| 6,576,967 B1 | 6/2003 | Schaeffer, III et al. ..... 257/411 |
| 6,617,624 B2 | 9/2003 | Powell ..................... 257/288 |
| 6,858,524 B2 * | 2/2005 | Haukka et al. ............ 438/585 |
| 6,955,986 B2 * | 10/2005 | Li ........................... 438/687 |
| 7,019,351 B2 * | 3/2006 | Eppich et al. ............. 257/303 |
| 2001/0013600 A1 * | 8/2001 | Cunningham ............. 257/1 |
| 2002/0037615 A1 | 3/2002 | Matsuo .................... 438/241 |
| 2003/0197230 A1 | 10/2003 | Mocuta et al. ............ 257/407 |
| 2003/0232506 A1 * | 12/2003 | Metzner et al. ........... 438/761 |
| 2004/0087124 A1 * | 5/2004 | Kubota et al. ............ 438/591 |
| 2004/0104439 A1 * | 6/2004 | Haukka et al. ............ 257/368 |

(Continued)

OTHER PUBLICATIONS

Yu, H.Y.; Lim, H.F.; Chen, J.H.; Li, M.F.; Chunxiang Zhu; Tung, C.H.; Du, A.Y.; Wang, W.D.; Chi, D.Z.; Kwong, D.-L.; Electron Device Letters, IEEE vol. 24, Issue 4, Apr. 2003 pp. 230-232.*

(Continued)

*Primary Examiner*—W. David Coleman
*Assistant Examiner*—Su C Kim
(74) *Attorney, Agent, or Firm*—Schwabe, Williamson & Wyatt, P.C.

(57) ABSTRACT

This invention relates to a semiconductor device making use of a highly thermal robust metal electrode as gate material. In particular, the development of Hafnium Nitride as a metal gate electrode (or a part of the metal gate stack) is taught and its manufacturing steps of fabrication with different embodiments are shown.

24 Claims, 4 Drawing Sheets

U.S. PATENT DOCUMENTS

| | | | |
|---|---|---|---|
| 2004/0129995 A1* | 7/2004 | Yeo et al. | 257/500 |
| 2004/0157473 A1* | 8/2004 | Hayashi et al. | 438/785 |
| 2004/0183143 A1* | 9/2004 | Matsuo | 257/407 |
| 2004/0198069 A1* | 10/2004 | Metzner et al. | 438/785 |
| 2004/0266204 A1* | 12/2004 | Lim et al. | 438/706 |
| 2005/0042373 A1* | 2/2005 | Kraus et al. | 427/248.1 |
| 2005/0167764 A1* | 8/2005 | Li | 257/406 |
| 2005/0269651 A1* | 12/2005 | Chen et al. | 257/411 |

OTHER PUBLICATIONS

Heuss et al., Abstract C7.6 "Thermal Stability of Hafnium and Hafnium Nitride (HfNx) Gate Electrodes on Silicon Dioxide," pp. 67, 76-77, Materials Res. Soc. Proc., Apr. 2000.

"Physical and Electrical Properties of Metal Gate Electrodes on $HfO_2$ Gate Dielectrics," by J.K. Schaeffer et al., *Journal of Vacuum Science and Tech.*, vol. 21(1), Jan./Feb. 2003, pp. 11-17.

"Thermal Stability of PVD Tin Gate and Its Impacts on Characteristics of CMOS Transistors," by M. Wang et al., *6th Int'l Symp. on Plasma Process Induced Damage*, May 14-15, 2001, Monterey, CA, USA, pp. 36-39.

"Metal Gates for Advanced Sub-80-nm SOI CMOS Technology," by. B. Cheng et al., 2001 IEEE Int'l SOI Conf., Oct. 2001, pp. 91-92.

"Properties and Microelectronic Applications of Thin Films of Refractory Metal Nitrides," by M. Wittmer, Jrnl. of Vacuum Science Tech. A, vol. 3, pp. 1797-1803.

"Int'l Tech. Roadmap for Semi conductor," Semi-conductor Industry Association, San Jose, CA (ITRS-2003).

* cited by examiner

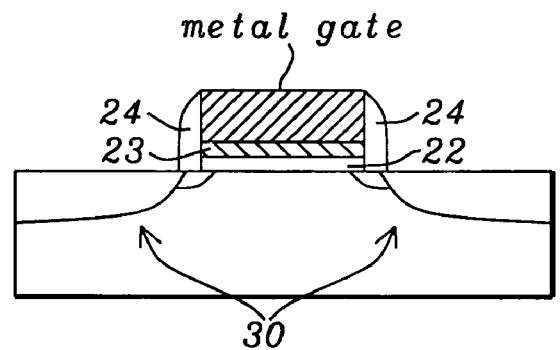
FIG. 1 – Prior Art
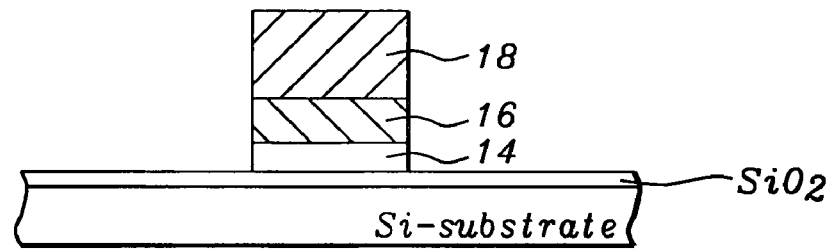
FIG. 2 – Prior Art
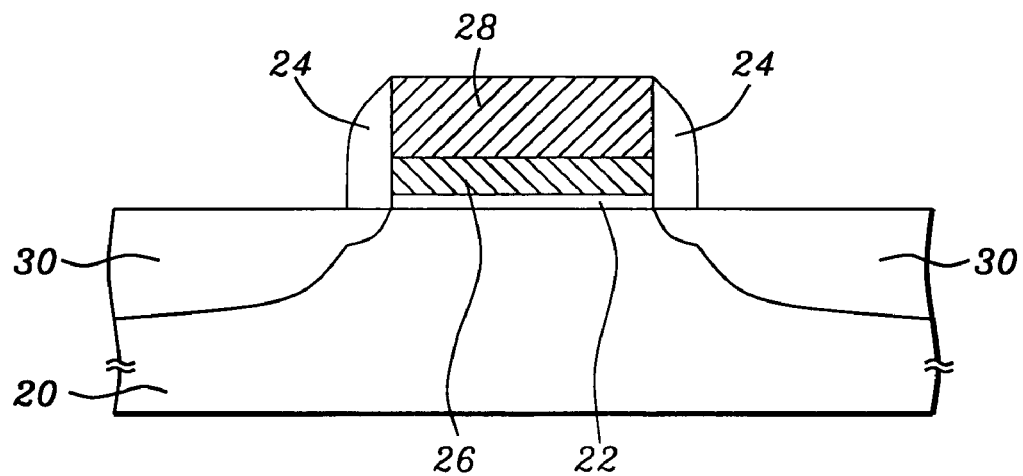
FIG. 3

THERMAL ROBUST SEMICONDUCTOR DEVICE USING HFN AS METAL GATE ELECTRODE AND THE MANUFACTURING PROCESS THEREOF

BACKGROUND OF THE INVENTION (1) Field of the Invention

The present invention relates in general to semiconductor devices and semiconductor manufacturing fabrication processes. More particularly, this invention presents an improved thermally robust semiconductor device having a metal electrode for both low power and high-performance sub-100 nm CMOS technologies.

(2) Description of the Prior Art

The whole of the semiconductor industry advancement is centered largely on the development of the device and processing techniques for its Complimentary Metal-Oxide-Semiconductor (CMOS) Field Effect Transistors (FET). In the very early days of MOSFET when aluminum was used as the metal gate, it only appears for a short period of time as the aluminum has a poor adhesion to the Silicon or Silicon dioxide ($SiO_2$) and high gate leakage so it was quickly replaced by poly-silicon with heavily doped N+ dopant. Polysilicon as a metal gate, or in short poly gate, has dominated CMOS technology for more than two decades. It has the advantages of good silicon adhesion, ease of processing, and no metal diffusion or penetration problems. Furthermore, the poly gate electrode can be readily scaled down without major impact to the CMOS processing. In high performance CMOS technology, when the gate size is scaled down to 0.15 and 0.13 um, dual doped gate electrodes (p+ dopant for the p-channel and n+ dopant for the n-channel) have been used to enhance its channel into surface mode. When CMOS devices are scaled further down to the sub-100 nm region, the gate oxide has shrunk to less than 5 nm, and the depletion layer formed in the polysilicon gate in inversion bias becomes a significant fraction of the gate capacitance and degrades the device performance. The use of a metal gate in these CMOS devices can alleviate this problem caused by polysilicon gate associated depletion effects and dopant penetration effects. See "International Technology Roadmap for Semiconductors", Semiconductor Industry Association, San Jose, Calif., 2001 (ITRS-2001).

U.S. patent application Ser. No. 2003/0197230 suggests the use of two different metals with appropriate work functions: a first metal with a first work function for the PFET area and a second metal with a second work function for the NFET area. However, this approach adds significant cost and complexity to the process. Alternatively, the same metal can be used for the gate of both the PFET area and NFET area with a mid-gap work function. While refractory metal nitrides such as TaN and TiN have been extensively investigated as the potential solutions to replace poly-Si, these materials show limited thermal stability and thus are incompatible with conventional CMOS processes (with thermal processing for activating the source and drain regions). See "Physical and electrical properties of metal gate electrodes on HfO2 gate dielectrics," by J. K. Schaeffer et. al., *Journal of Vacuum Science and Technology* Vol. 21(1), January/February 2003, p. 11-17 and "Thermal Stability of PVD TiN Gate and Its Impacts on Characteristic of CMOS Transistors," by M. Wang et. al. 6th *International Symposium on Plasma Process Induced Damage*, May 14-15 Monterey Calif. USA, 2001, p. 36-39

The thermal stability of HfN is superior to TiN and TaN, due to its negatively larger heat of formation compared to that of TiN and TaN (HfN:-88.2, TiN:-80.4, TaN:-60.3; kcal/mol) See "Properties and microelectronic applications of thin films of refractory metal nitrides", by M. Wittmer, *Journal of Vacuum Science Technology A*, vol. 3, pp. 1797-1803, 1985. An attempt making use of HfNx as the metal gate has been reported. Heuss et al. in his abstract (see Heuss at al. "Thermal stability of Hafnium and Hafnium Nitride (HfNx) Gate Electrodes on Silicon Dioxide", Materials Research Society Proceedings, April 2000) discussed the use of HfNx as the metal gate material but do not recommend the application of HfN as the gate electrode. U.S. Pat. No. 6,225,168 to Gardner, et al. shows a metal gate electrode and a titanium or tantalum nitride as gate dielectric barrier layer and the processes for fabricating such devices. FIG. 1 shows a bulk CMOS with metal gate stack structure of Gardner et al. wherein TiN is the barrier metal and TaN is the capping layer.

U.S. Pat. No. 6,383,879 to Kizilyalli, et al. presents a method to form dual metal gates for the different work function for NMOS and PMOS transistors.

U.S. Pat. No. 6,511,911 to Besser, et al. gives a metal gate stack structure comprised of Tungsten, tantalum, TiN and etch stopper which is used for the deep submicron CMOS process. FIG. 2 depicts the gate stack structure of Besser et al. wherein tungsten is used as capping layer 18 and TiN as the barrier metal 14. Second metal layer Ta 16 is deposited in between the capping layer 18 and barrier layer 14.

U.S. Pat. No. 6,617,624 to Powell teaches a metal gate stack include a doped polysilicon, TiN and Tungsten with Nitride passivation and its formation processes U.S. Pat. No. 6,043,157 to Gardner et al shows a process for forming dual gates where one gate is polysilicon and the other gate is metal.

U.S. Pat. No. 5,960,270 to Misra et al discloses a process wherein the same mid-gap work function metal is used for both n- and p-gates. U.S. Pat. No. 6,083,836 to Rodder teaches a dummy gate process where two gates are formed. For example, one gate is polysilicon and the other is aluminum. U.S. Pat. No. 6,051,487 to Gardner et al teaches a dummy gate process using a polysilicon or a metal gate.

SUMMARY OF THE INVENTION

A primary object of the invention is to provide a metal gate having robust thermal stability so that the equivalent oxide thickness (EOT) of the gate stack will not increase during the gate dielectric material growth.

Another object of the invention is to provide a formation process of the metal gate structure, which is compatible with the thermal annealing of the transistor's source and drain activation.

A still further object of this invention is to provide the metal gate structure having its work function tunable by varying process conditions. Yet another object of this invention is to provide a gate material that is sufficient to prevent oxygen diffusion through the gate stack during thermal processing.

In accordance with the objects of the invention, hafnium nitride (HfN) as the gate material is presented and the formation process of such a gate is given. The semiconductor structure composition consists of at least one underlying dielectric. In common practice, it can be either the conventional $SiO_2$ or the more recent high dielectric constant (high-K) material of $HfO_2$, though not only limited to the two. The gate material of HfN exhibits a mid-gap work function and shows robust resistance against high temperature treatment. In particular, the equivalent oxide thickness (EOT) and gate leakage show little variation. The superior oxygen diffusion barrier property as well as the excellent thermal stability of HfN/$HfO_2$ and HfN/SiO$_2$ interface makes it an ideal candidate for the sub-65nm for both bulk and SOI CMOS technologies in place of the conventional poly-Si gate material. The gate structure is also ready to be implemented into the symmetrical dual gate transistor structure (SDG).

BRIEF DESCRIPTION OF THE DRAWINGS

In the accompanying drawings forming a material part of this description, there is shown:

FIG. 1 is a cross-sectional representation of a bulk CMOS with metal gate stack structure in the prior art (see U.S. Pat. No. 6,225,168 to Gardner et al.) wherein TiN is the barrier metal 23 and TaN is the capping layer.

FIG. 2 depicts the gate stack structure of the prior art (see U.S. Pat. No. 6,511,911 to Besser et al.) wherein tungsten is used as capping layer 18 and TiN as the barrier metal 14. Second metal layer Ta 16 is deposited in between the capping layer 18 and barrier layer 14.

FIG. 3 is a cross-sectional representation of the preferred embodiment of the present invention as in the bulk CMOS where HfN can be used as the gate material.

DESCRIPTION OF THE PREFERRED EMBODIMENTS

Referring now more particularly to FIG. 3, there is shown a semiconductor substrate 20. This is preferably monocrystalline silicon. Isolation regions, such as shallow trench isolation (STI), not shown in the figure, are formed in the substrate as is conventional in the art to separate active regions. N-wells and P-wells, not shown, may be formed within the substrate, as is conventional.

Figure 4:
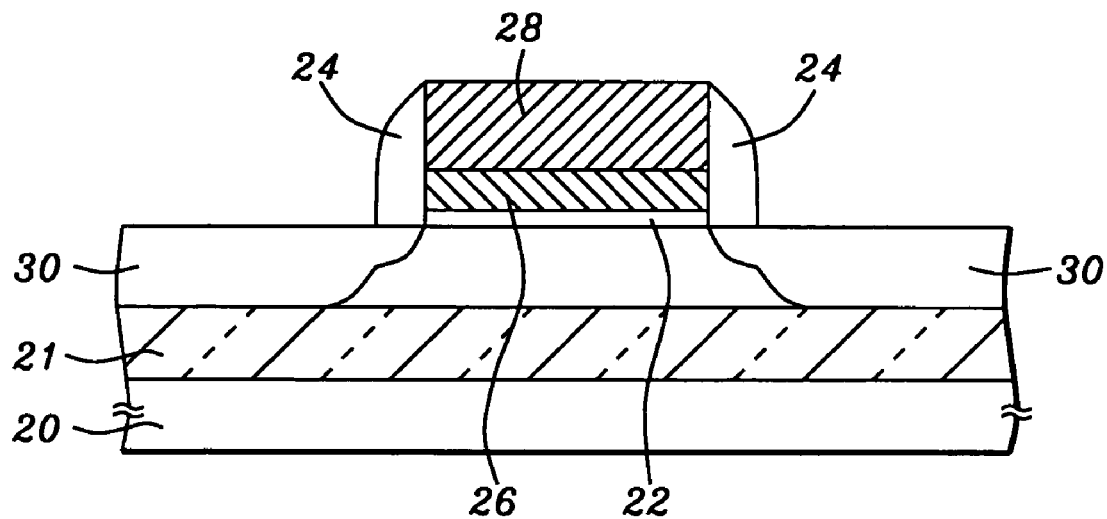
FIG. 4 is a cross-sectional representation of a second preferred embodiment of the invention as in a silicon-on-insulator (SOI) device.

Punchthrough and threshold voltage adjustment implantations, not shown, are made as is conventional in the art. FIG. 4 illustrates an alternative where the substrate is a silicon-on-insulator substrate. All processing is the same with both substrate alternatives.

A gate dielectric layer 22 is grown or deposited over the substrate to a thickness of between about 15 and 150 Angstroms. For example, the dielectric layer may be a low dielectric constant material such as silicon dioxide, nitrided silicon dioxide, silicon nitride, or their combinations. Alternatively, the dielectric layer may be a high dielectric constant gate dielectric material such as zirconium oxide, hafnium oxide, aluminum oxide, tantalum pentoxide, barium strontium titanates, and crystalline oxide.

Figure 5:
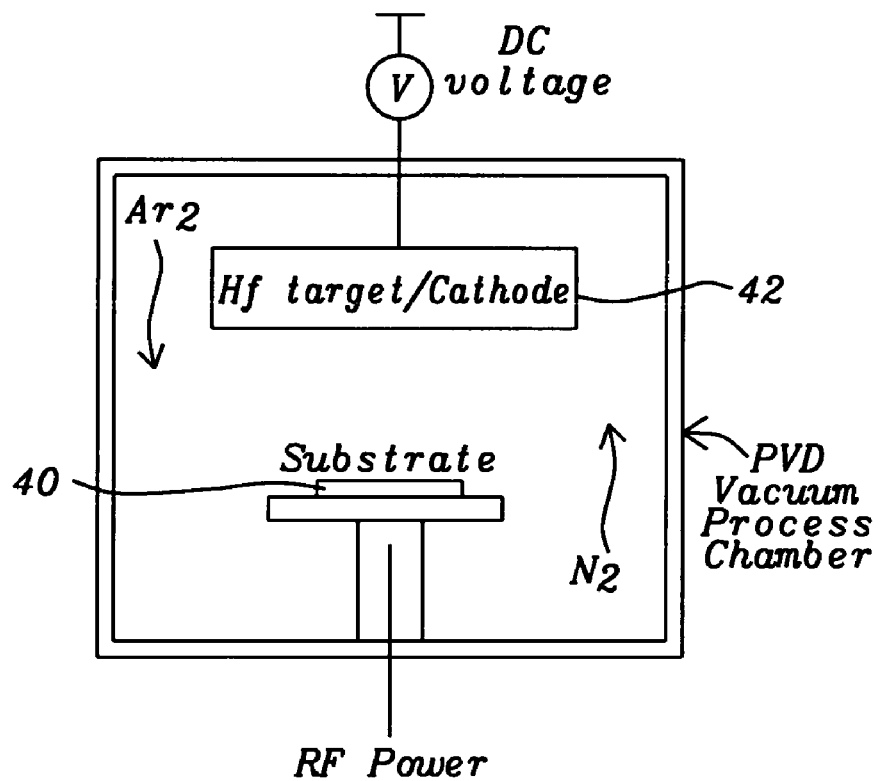
FIG. 5 shows a typical setup of physical vapor deposition (PVD) for the formation of HfN.

Referring now in particular to FIG. 5, after pre-gate cleaning, the gate dielectric has been thermally grown and the substrate 40 is placed in the PVD vacuum chamber. The PVD chamber is initially set at a base pressure of less than $2e^{-7}$ Torr, flowing the Nitrogen and Argon gases at a constant flow rate of N$_2$/Ar at ratio of 5 sccm/25 sccm, DC power set on the Hf target (42) at 450 W, and RF power set on substrate 40 at 12 W. During the sputtering deposition, the gas pressure is maintained at 2 mTorr inside the chamber. This will lead to a deposition rate of approximately 8.2 nm/min.

A metal layer of HfN 26 (~50 nm) is then formed and the mid gap work function shall be at approximately 4.65 eV. This HfN has the composition of Hf/N atomic ratio of 1. To obtain the excellent thermal stability of HfN, the ratio of Hafnium to nitrogen should be controlled to be less than or equal to one (equal amounts or more of nitrogen). By varying the Hf to Nitrogen ratio by way of changing the nitrogen flow, the mid gap work function can be tuned. Alternatively the metal layer 26 may be formed by evaporation, or chemical vapor deposition (CVD). Alternatively, the work function may be tuned or adjusted by impurity doping into the HfN layer.

A TaN (~100 nm) capping layer 28 is sputtered on the HfN gate metal layer to achieve a low gate sheet resistance (~10 Ohm/sq.). The TaN/HfN stack is then etched using a plasma dry etch method (RIE: Reactive Ion Etch) having Chlorine (Cl$_2$) gas based chemistry. Other capping layers such as tungsten may be used.

Figure 6:
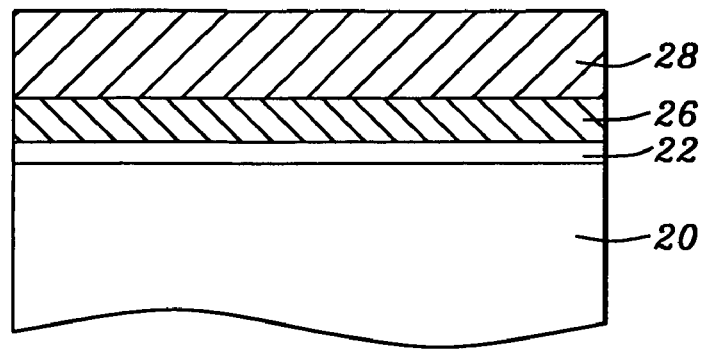
FIG. 6 through FIG. 10 shows the process steps in forming the bulk CMOS transistor with HfN as the metal gate electrode.
Figure 7:
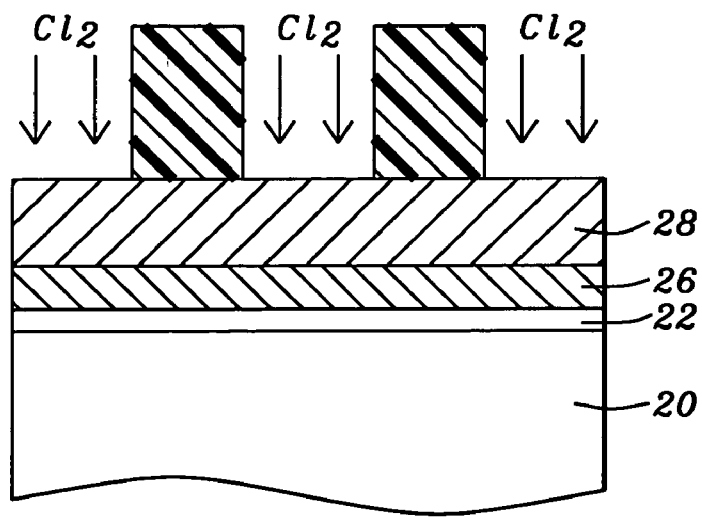

Refer now to FIGS. 6 and 7. The metal and metal capping layers, 26 and 28, respectively, are deposited on the underlying dielectric and then patterned to form gate electrodes. This gate stack contains a first portion 26/28 having the composition of Hafnium and nitrogen and the second portion 22, underlying the first portion, having the composition of Hafnium and oxygen, or silicon and oxygen or other gate dielectric whereas the second portion is in contact with the silicon substrate. A chemical mechanical polishing (CMP) process may be applied to achieve planarization. This gate stack has the capability of scale down to at least below 10 Å, and could be utilized for sub-65 nm CMOS technology. The above gate stack structure after thermal treatment of 1000° C. RTA for 20 sec without using surface nitridation prior to HfO$_2$ deposition, can still maintain very good stability and EOT (equivalent oxide thickness) changes of less than 2 Angstroms.

Alternatively, the first metal layer 26 may be tungsten or tantalum nitride, for example. Then HfN may be deposited as described above as the capping layer 28. After photoresist 60 patterning by masking steps, the gate stack is then patterned by chlorine based dry etch to form the gate electrode having a dielectric layer 22, a first metal layer 26 on the dielectric layer, and a HfN capping layer 28 on the first metal layer.

Figure 8:
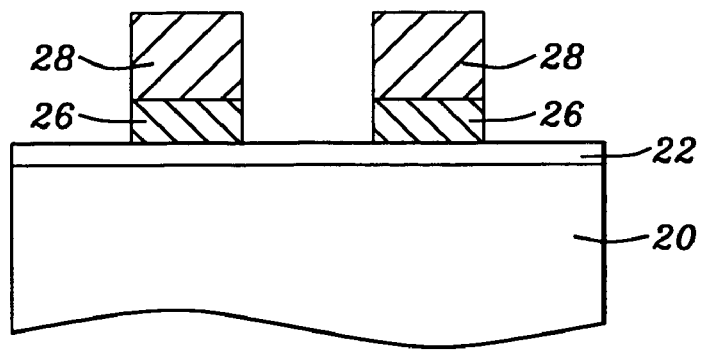
Figure 9:
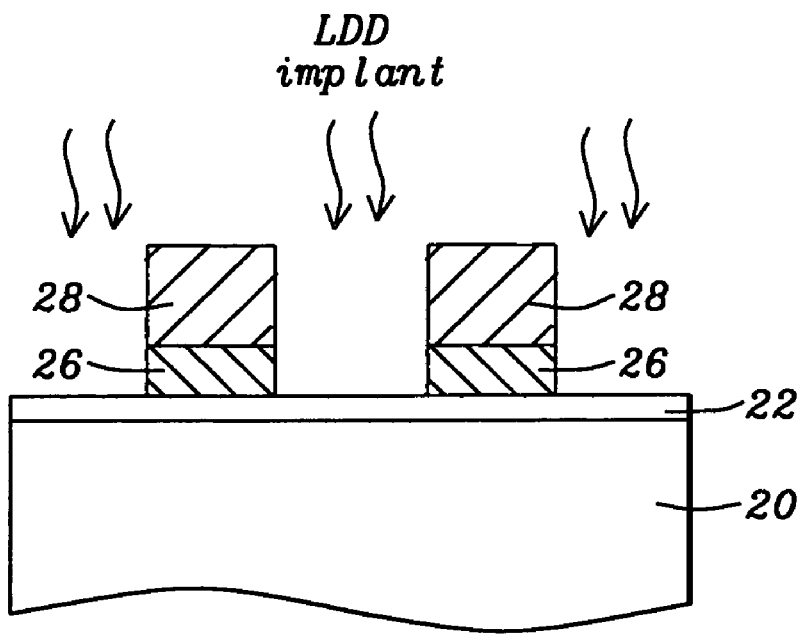
Figure 10:
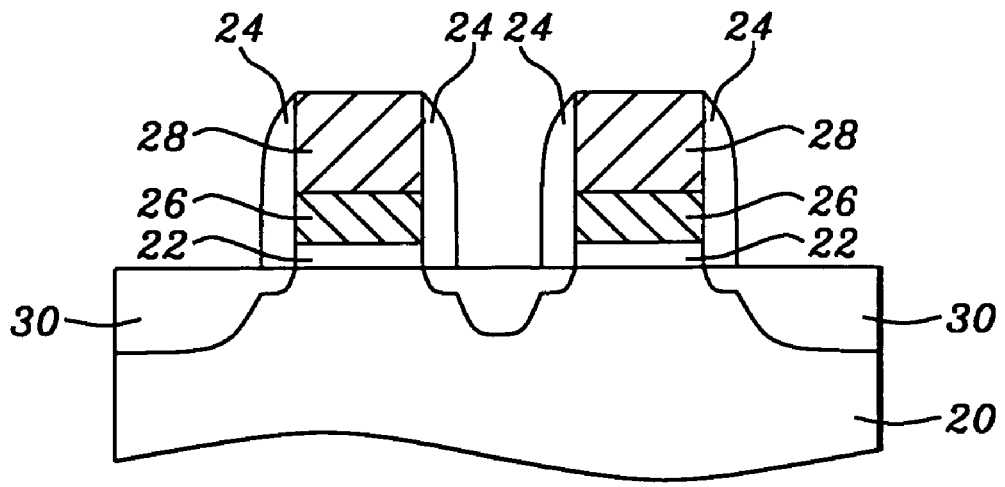

Referring now to FIGS. 8 through 10, source and drain regions 30 and sidewall spacers 24 may be formed, as is conventional. The spacers 24 may comprise either silicon nitride or silicon oxide. Processing continues as is conventional in the art.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a CMOS semiconductor device structure comprising gate electrodes, said method comprising:

providing a dielectric layer on a substrate;
depositing a hafnium nitride layer on said dielectric layer wherein an atomic ratio of Nitrogen and Hafnium of said hafnium nitride layer is adjusted to adjust the workfunction of said gate electrodes wherein said atomic ratio of nitrogen to hafnium remains greater than one, wherein said depositing of said hafnium nitride layer comprises flowing Nitrogen and Argon atoms into a chamber simultaneously wherein said chamber contains said substrate and a hafnium target;
depositing a capping layer on said hafnium nitride layer;
patterning said hafnium nitride layer and said capping layer and said dielectric layer to form said CMOS gate electrodes; and forming source and drain regions within said substrate adjacent to said CMOS gate electrodes.

2. The method according to claim 1 wherein argon and nitrogen flow rates are kept as constant at 25 sccm and 5 sccm, respectively.

3. The method according to claim 1 wherein said dielectric layer comprises $HfO_2$ and is deposited at 400° C. using a MOCVD cluster tool.

4. The method according to claim 1 wherein said dielectric layer comprises $HfO_2$ and wherein said dielectric layer is subjected to post-deposition annealing (PDA) at 700° C. in a $N_2$ ambient.

5. The method according to claim 1 further comprising impurity doping into said hafnium nitride layer to tune the work-function of said gate electrodes.

6. The method according to claim 1 further comprising thermal treatment of said hafnium nitride layer by rapid thermal annealing (RTA) at about 1000° C. for about 20 seconds.

7. A method for fabricating a CMOS semiconductor device structure comprising:
providing a dielectric layer on a substrate;
depositing a hafnium nitride layer on said dielectric layer wherein said depositing comprises flowing Nitrogen and Argon atoms into a chamber simultaneously wherein said chamber contains said substrate and a hafnium target and wherein an atomic ratio of Nitrogen and Hafnium of said hafnium nitride layer is adjusted to adjust the work-function of said gate electrodes wherein said atomic ratio of nitrogen to hafnium remains greater than one;
depositing a titanium nitride or tungsten capping layer on said hafnium nitride layer;
patterning said hafnium nitride layer and said capping layer and said dielectric layer to form CMOS gate electrodes; and
forming source and drain regions within said substrate adjacent to said CMOS gate electrodes.

8. The method according to claim 7 wherein said dielectric layer comprises $HfO_2$, silicon dioxide, silicon nitride, nitrided silicon dioxide, zirconium oxide, aluminum oxide, tantalum pentoxide, barium strontium titanates, or crystalline oxides.

9. The method according to claim 7 further comprising impurity doping into said hafnium nitride layer to tune the work-function of said gate electrodes.

10. A method for fabricating a CMOS semiconductor device structure comprising:
providing a dielectric layer on a substrate;
depositing a first metal layer on said dielectric layer;
depositing a second metal capping layer on said first metal layer wherein said depositing comprises flowing Nitrogen and Argon atoms into a chamber simultaneously wherein said chamber contains said substrate and a hafnium target to form said second metal capping layer comprising hafnium nitride;
patterning said first metal layer, said second metal capping layer, and said dielectric layer to form CMOS gate electrodes; and
forming source and drain regions within said substrate adjacent to said CMOS gate electrodes.

11. The method according to claim 10 wherein said dielectric layer comprises $HfO_2$.

12. The method according to claim 10 wherein said first and second metal layers are deposited by physical vapor deposition or chemical vapor deposition.

13. The method according to claim 10 wherein said first metal layer comprises tungsten or tantalum nitride.

14. The method according to claim 10 further comprising adjusting the flow rate of said Nitrogen and Argon atoms to adjust the work-function of said gate electrodes wherein the atomic ratio of nitrogen to hafnium remains greater than or equal to one.

15. The method according to claim 10 further comprising impurity doping into said hafnium nitride layer to tune the work-function of said gate electrodes.

16. The method according to claim 10 further comprising thermal treatment of said hafnium nitride layer by rapid thermal annealing (RTA) at about 1000° C. for about 20 seconds.

17. A method for fabricating a CMOS semiconductor device structure comprising gate electrodes, said method comprising:
providing a dielectric layer on a substrate;
depositing a first metal layer on said dielectric layer wherein said depositing of said first metal layer comprises flowing Nitrogen and Argon atoms into a chamber simultaneously wherein said chamber contains said substrate and a hafnium target to form a hafnium nitride layer as a first metal layer and wherein an atomic ratio of Nitrogen and Hafnium of said hafnium nitride layer is adjusted to adjust the work-function of said gate electrodes wherein said atomic ratio of nitrogen to hafnium remains greater than one;
depositing a second metal capping layer on said first metal layer wherein said second metal is different from said first metal;
patterning said second metal capping layer, said first metal layer, and said dielectric layer to form said CMOS gate electrodes; and
forming source and drain regions within said substrate adjacent to said CMOS gate electrodes.

18. The method according to claim 17 wherein said second metal capping layer comprises tungsten or tantalum nitride.

19. The method according to claim 17 wherein said first and second metal layers are deposited by physical vapor deposition or chemical vapor deposition.

20. The method according to claim 17 wherein argon and nitrogen flow rates are kept as constant at 25 sccm and 5 sccm, respectively.

21. The method according to claim 17 wherein said dielectric layer comprises $HfO_2$ and is deposited at 400° C. using a MOCVD cluster tool.

22. The method according to claim 17 wherein said dielectric layer comprises $HfO_2$ and wherein said dielectric layer is subjected to post-deposition annealing (PDA) at 700° C. in a $N_2$ ambient.

23. The method according to claim 17 further comprising impurity doping into said hafnium nitride layer to tune the work-function of said gate electrodes.

24. The method according to claim 17 further comprising thermal treatment of said hafnium nitride layer by rapid thermal annealing (RTA) at about 1000° C. for about 20 seconds.

* * * * *